United States Patent
Larson et al.

(10) Patent No.: US 8,022,145 B2
(45) Date of Patent: *Sep. 20, 2011

(54) DICING AND DIE ATTACH ADHESIVE

(75) Inventors: Eric G. Larson, Lake Elmo, MN (US);
Michael A. Kropp, Cottage Grove, MN (US); David J. Plaut, Minneapolis, MN (US); Cheryl L. Moore, Afton, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 128 days.

This patent is subject to a terminal disclaimer.

(21) Appl. No.: 12/530,692

(22) PCT Filed: Mar. 7, 2008

(86) PCT No.: PCT/US2008/056178
§ 371 (c)(1),
(2), (4) Date: Sep. 10, 2009

(87) PCT Pub. No.: WO2008/115711
PCT Pub. Date: Sep. 25, 2008

(65) Prior Publication Data
US 2010/0056725 A1    Mar. 4, 2010

Related U.S. Application Data

(60) Provisional application No. 60/895,189, filed on Mar. 16, 2007.

(51) Int. Cl.
C08F 8/00 (2006.01)
C08L 33/02 (2006.01)
C08L 33/04 (2006.01)
C08L 35/02 (2006.01)
B32B 7/12 (2006.01)
B32B 15/04 (2006.01)
H01L 21/76 (2006.01)

(52) U.S. Cl. ......... 525/193; 525/195; 525/221; 525/222; 428/355 R; 428/355 EP; 428/355 EN; 428/355 AC; 438/464

(58) Field of Classification Search .................. 525/193, 525/195, 221, 222; 428/355 R, 355 EP, 355 EN, 428/355 AC; 438/464
See application file for complete search history.

(56) References Cited

U.S. PATENT DOCUMENTS

| | | |
|---|---|---|
| 4,968,559 A | 11/1990 | Kuroda et al. |
| 5,049,085 A | 9/1991 | Reylek et al. |
| 5,234,730 A | 8/1993 | Lautenschlaeger et al. |
| 5,300,788 A | 4/1994 | Fan et al. |
| 5,574,117 A | 11/1996 | Yoshida et al. |
| 6,048,953 A | 4/2000 | Kawashima et al. |
| 6,180,527 B1 | 1/2001 | Farnworth et al. |
| 6,265,460 B1 | 7/2001 | Kawate et al. |
| 6,548,566 B1 | 4/2003 | Huebener et al. |
| 6,960,617 B2 | 11/2005 | Omidian et al. |
| 7,129,150 B2 | 10/2006 | Kawai |
| 7,858,499 B2 * | 12/2010 | Plaut et al. ............ 438/464 |
| 2001/0031837 A1 | 10/2001 | Perez et al. |
| 2002/0007910 A1 | 1/2002 | Bennett et al. |
| 2002/0076848 A1 | 6/2002 | Spooner et al. |
| 2005/0154089 A1 | 7/2005 | Taylor et al. |
| 2005/0208296 A1 | 9/2005 | Saiki et al. |
| 2006/0073334 A1 | 4/2006 | Schwantes et al. |
| 2006/0211220 A1 | 9/2006 | Sakaya et al. |
| 2006/0252234 A1 | 11/2006 | Saiki |
| 2011/0064948 A1 * | 3/2011 | Plaut et al. ............ 428/355 EP |

* cited by examiner

*Primary Examiner* — Nathan M Nutter

(57) ABSTRACT

Provided is a single layer adhesive that provides the appropriate balance of adhesion and clean release required for a wafer dicing function and also provides the necessary bond required in a subsequent die attach step. The adhesive composition comprises an acrylate ester polymer having a functional group, a multi-functional thermosetting resin, wherein the acrylate ester polymer and the thermosetting resin are capable of reacting with each other, a multi-functional acrylate ester, an acrylate ester polymerization catalyst or curing agent, a thermally-latent catalyst suitable for curing the multi-functional thermosetting resin, and an acrylic acid salt.

20 Claims, No Drawings

DICING AND DIE ATTACH ADHESIVE

CROSS REFERENCE TO RELATED APPLICATION

This application claims the benefit of U.S. Provisional Patent Application No. 60/895,189, filed Mar. 16, 2007, the disclosure of which is incorporated by reference herein in its entirety.

TECHNICAL FIELD

This relates generally to a single layer adhesive which functions as a dicing tape and also as a die attach adhesive for dicing thinned wafers and subsequent die attach operations of the diced chips in semiconductor device fabrication.

BACKGROUND

Wafers of semiconductor material such as silicon and gallium-arsenide with integrated circuits formed thereon have a relatively large diameter. In the production of integrated circuits (IC), such a wafer is adhered to a pressure sensitive adhesive tape, sometimes called a dicing tape, and diced into IC chips. The IC chips (die or dice) are then removed from the dicing tape, an adhesive is applied to the chip or to a substrate, the chip is placed on the substrate and the adhesive is cured to attach the die to the substrate.

Dicing tapes must provide strong adhesion to a semiconductor wafer during the step of dicing the wafer into individual chips. However, the dicing tape also should subsequently provide a sufficiently low adhesion to the die to allow the individual chips to be removed from the tape quickly, cleanly, and easily. That is, it is useful for the dicing tape to have a reduced adhesion when the chip is removed, and there should be no residue from the dicing tape on the chip. Therefore dicing tapes have been prepared that have a balance of adhesion to the wafer to adhere strongly during the dicing step, but the tape also releases from the individual chips without leaving a residue on the chip when the chip is removed from the tape. Some dicing tapes have been prepared which may be detackified upon exposure to ultraviolet light to improve the clean removal of individual chips. Without a balance of adhesion, it is difficult to carry out the steps of dicing the wafer and picking and placing the individual chips. If the adhesion of the dicing tape is not balanced and some adhesive remains on the individual chip when it is removed from the dicing tape, additional steps are required to remove the adhesive residue from the chip. These additional steps often include organic solvents.

After the dicing operation and chip singulation is complete, a second adhesive subsequently must be placed between the chip and the substrate to hold the chip securely in place on a substrate. The second adhesive, often referred to as a die attach adhesive, can be applied to the surface of a chip that is opposite the circuits or it may be applied directly to the substrate to which the chip will be bonded. Using a separate die attach adhesive requires additional steps and equipment to place the adhesive either on the chip or the substrate. Some separate die attach adhesives have been epoxy resins that can be cured once the chip has been placed on the substrate.

SUMMARY

A need has been found for a single layer adhesive film that provides the appropriate balance of adhesion and clean release as required for the wafer dicing function, enables transfer of the adhesive from a film backing after singulation, and also provides the necessary bond required in a subsequent die attach step.

Accordingly in one embodiment, the present disclosure relates to an adhesive composition comprising an acrylate ester polymer having a functional group, a multi-functional thermosetting resin, a multi-functional acrylate ester, an acrylate ester polymerization catalyst or curing agent, a thermally-latent catalyst suitable for curing the multi-functional thermosetting resin, and an acrylic acid salt, wherein the acrylate ester polymer and the thermosetting resin are capable of reacting with each other. For the purposes of this disclosure, the terms acrylate and acrylic include derivatives of both acrylic and methacrylic acid. References to an acrylate ester polymer having a functional group are to be understood as describing a moiety having at least one functional group other than an acryl or methacryl group.

In other embodiments, the present disclosure relates to an adhesive comprising at least about 50 weight percent (wt %) of a functional group containing acrylate ester polymer, from about 20 wt % to about 40 wt % of a multi-functional thermosetting resin, an effective amount of a multi-functional acrylate ester, a catalyst for curing the acrylate ester polymer, a thermally latent catalyst or curing agent for curing the multi-functional thermosetting resin, and an acrylic acid salt, wherein the acrylate ester polymer and the thermosetting resin are capable of forming an adhesive reaction product.

In yet other embodiments, the present disclosure relates to a method of making an adhesive comprising providing an acrylate ester polymer having a functional group, providing a multi-functional thermosetting resin, wherein the acrylate ester polymer and the thermosetting resin are capable of reacting with each other, providing a multi-functional acrylate ester, providing an acrylate ester polymerization catalyst or curing agent, providing a thermally-latent catalyst suitable for curing the multi-functional thermosetting resin, providing an acrylic acid salt, optionally a metal salt, mixing the polymer, thermosetting resin, multi-functional acrylate ester, thermally-latent catalyst, and an acrylic salt to form a mixture, and optionally degassing the mixture.

DETAILED DESCRIPTION

The recitation of numerical ranges includes all numbers within that range (e.g., 1 to 5 includes 1, 1.5, 2, 2.75, 3, 3.80, 4, and 5). All numbers are herein assumed to be modified by the term "about".

In one embodiment, provided is an adhesive composition comprising an acrylate ester polymer having a functional group, a multi-functional thermosetting resin, together a multi-functional acrylate ester, an acrylate ester polymer catalyst or curing agent, a thermally-latent catalyst suitable for curing the multi-functional thermosetting resin, and an acrylic acid salt, wherein the acrylate ester polymer and the thermosetting resin are capable of reacting with each other.

Suitable acrylate ester polymers having a functional group include, for example, copolymers of linear or branched monofunctional unsaturated acrylates or methacrylates of non-tertiary alkyl alcohols, the alkyl groups of which have from 1 to 14 and, in particular, from 4 to 12 carbon atoms with one or more (meth)acrylate functional monomers bearing an additional functional group. Commonly employed monofunctional monomers include butyl(meth)acrylate, 2-ethylhexyl(meth)acrylate, ethyl(meth)acrylate, methyl(meth)acrylate, n-propyl(meth)acrylate, isopropyl(meth)acrylate, t-butyl (meth)acrylate, pentyl(meth)acrylate, n-octyl(meth)acrylate, isooctyl(meth)acrylate, isononyl(meth)acrylate and 2-ethylbutyl(meth)acrylate. (Meth)acrylate functional monomers bearing an additional functional group include the monomers above wherein the (meth)acrylate ester also bears one or more substituents selected from a carboxylic acid group, a hydroxyl group, a glycidyl group, an amide group, and an anhydride group. Particularly preferred in some embodiments are (meth)acrylic ester monomers having an additional functional group that may be one or more of acrylic acid, methacrylic acid, hydroxy ethyl acrylate, hydroxy ethyl methacrylate, hydroxy propyl acrylate, hydroxy propyl methacrylate, hydroxy butyl acrylate, hydroxy butyl methacrylate, glycidyl acrylate, or glycidyl methacrylate, and N-methylol acrylamide.

Suitable multi-functional thermosetting resins include, for example, polyepoxy functional resins and their aziridine analogs. The multifunctional glycidyl ether epoxy resin is present in the adhesive compositions of the invention at an amount from about 15 wt % to about 40 wt %. In other embodiments, the multifunctional glycidyl ether epoxy resin is present in the adhesive compositions from about 23 wt % to about 37 wt %. Other adhesive compositions of the invention may contain any amount or any range of amount between 15 wt % and 40 wt % of multifunctional glycidyl ether epoxy.

Preferred multifunctional glycidyl ether epoxy resins include those epoxy resins having more than two glycidyl groups on average within a molecule. Specific examples of the glycidyl ether epoxy resin include multifunctional phenol novolak-type epoxy resins (synthesized by reacting phenol novolak with epichlorohydrin) cresol novolak epoxy resin, and bisphenol A novolak epoxy resins. Examples of commercially available multifunctional glycidyl ether epoxy resins include those epoxy resins having the trade designations Epon 1050, Epon 160, Epon 164, Epon 1031, Epon SU-2.5, Epon SU-3, And Epon SU-8, available from Hexion Specialty Chemicals, Columbus, Ohio; the "DEN" series of epoxy resins, available from Dow Chemical Co., Midland Mich.; and Tactix 756, and Tactix 556 epoxy resin, available from Huntsman Chemical, East Lansing, Mich.

In some embodiments, useful multifunctional glycidyl ether epoxy resins that are diglycidyl ethers of bisphenol A include, but are not limited to, those having the trade designations Epon Resins 825, 826, and 828, available from Hexion Specialty Chemicals; D.E.R. 330, 331, and 332 resins, available from Dow Chemical Co.; and Araldite GY 6008, GY 6010, and GY 2600 resins, available from Ciba Specialty Chemicals, Tarrytown, N.Y.

Examples of useful multifunctional glycidyl ether epoxy resins that are diglycidyl ethers of bisphenol F include, but are not limited to those having the trade designations EPON Resin 862 resin, available from Hexion Specialty Chemicals; and Araldite GY 281, GY 282, GY 285, PY 306, and PY 307 resins, available from Ciba Specialty Chemicals.

The multifunctional glycidyl ether epoxy resin usually has an epoxy equivalent weight of from about 170 to about 500, in other embodiments, from about 170 to about 350, and in other embodiments from about 170 to about 250. Ranges for the average epoxy functionality include from 1.5 to 10.

The acrylate ester polymer and the thermosetting resin are capable of reacting with each other, typically via a ring-opening reaction or a condensation reaction, such that the reaction product is a chain-extended and/or crosslinked polymer.

Suitable multi-functional acrylate esters include, for example, (meth)acrylate esters of di-, tri-, and tetra-hydroxy compounds such as ethylene glycol diacrylate, polyethylene glycol diacrylate, ethylene glycol dimethacrylate, hexanediol diacrylate, triethylene glycol diacrylate, trimethylolpropane triacrylate, glycerol triacrylate, pentaerthyitol triacrylate, pentaerythritol trimethacrylate, pentaerythritol tetraacrylate and pentaerythritol tetramethacrylate. Acrylate esters of hyperbranched polyols such as CN2301, 2302, 2303, 2304 available from Sartomer Co, Exton, Pa. are also useful. Trimethylolpropane triacrylate is particularly suitable for reducing tack of the adhesive by photochemically induced polymerization.

Suitable acrylate ester polymerization catalysts include, for example, photoinitiators and thermal initiators with photoinitiators being generally preferred in applications where extended shelf-life is particularly desirable. Examples of suitable ultraviolet-activated photoinitiators available as Irgacure™ 651, Irgacure 184, Irgacure 369 and Irgacure 819, and Darocumm™ 1173, all products of Ciba Specialty Chemicals Co., and Lucirin™ TPO-L, a product of BASF Corp.

In some embodiments, thermal initiators may be used. Thermal initiators include organic peroxides (e.g., benzoyl peroxide), azo compounds, quinones, nitroso compounds, acyl halides, hydrazones, mercapto compounds, pyrylium compounds, imidazoles, chlorotriazines, benzoin, benzoin alkyl ethers, diketones, phenones, and mixtures thereof. Examples of suitable thermal initiators are sold as Vazo 52, Vazo 64 and Vazo 67 azo compound thermal initiators, all from DuPont.

Suitable thermally-latent catalyst suitable for curing the multi-functional thermosetting resin include, for example, latent catalysts useful in one part epoxy adhesives. Illustrative catalysts include blocked imidazoles MZ-A, MA-OK and PHZ-S (Air Products) and polymer bound imidazoles such as Intelimer 7004 (Landec Inc.) In some embodiments, imidazole catalysts, especially solids, such as 1,3 dialkylimidiazolium salts, imidiazole derivative-transition metal complexes, 2-ethyl-4-methylimidazole, 2-phenyl-4-methylimidazole, 2,4-diamino-6-[2'-methylimidazolyl-(1)']ethyl-s-triazine, and the like may be used. The catalyst, if present in an embodiment, comprises at least about 0.01 wt %, preferably at least about 0.1 wt % of the composition. In other embodiments, the catalyst can comprise no more than about 5 wt % of the composition, preferably no more than about 10 wt %.

Suitable acrylic acid salts include, for example, (meth) acrylic acid containing oligomer units joined by one or more polyvalent metal salt bridges. Such salt bridges may dissociate at higher than ambient temperatures thereby improving flow of the adhesive composition. Suitable acrylic acid salts include Sartomer CN2404, a polyester acrylate oligomer, and CN2405, a urethane acrylate oligomer.

In some embodiments, the multi-functional thermosetting resin is an epoxy resin. In some embodiments, the acrylate ester polymer is a copolymer of butylacrylate and glycidyl methacrylate. In still other embodiments, the multi-functional acrylate ester comprises trimethylolpropanetriacrylate.

In some embodiments, the polymer catalyst or curing agent is a photo-initiated free radical curing agent. In some embodiments, the thermally-latent catalyst is an imidazole accelerator. In yet other embodiments, the acrylic acid salt is a metal salt of acrylic acid.

In some embodiments, the semiconductor wafer has an active surface, a substrate surface, and a layer of the adhesive that is adjacent the substrate surface. The active surface of the semiconductor wafer is the region having integrated circuits whereas the substrate surface does not have integrated circuits. In other embodiments, the semiconductor chip has an active surface, a substrate surface, and a region of cured adhesive that is adjacent the substrate surface. In some embodiments, the adhesive has a backing. In yet other embodiments, the components of the adhesive are combined and coated onto a release liner to form an adhesive tape precursor. In some embodiments, the adhesive tape precursor is heated to form a tape. In other embodiments, the adhesive tape precursor is laminated to a suitable backing. The backing, if present, may be an elastomer such as ethylene propylene rubber (EPR), an ionomeric polymer, e.g., DuPont's Surlyn®, or the like. In yet other embodiments, the tape is laminated to a wafer.

Objects and advantages of this invention are further illustrated by the following examples, but the particular materials and amounts thereof recited in these examples, as well as other conditions and details, should not be construed to unduly limit this invention.

EXAMPLES

List of Materials

Test for Voids in the Bondline

An adhesive film sample was laminated to a glass microscope cover slip with a hand held rubber roller. The laminated film sample was treated with UV irradiation (Fusion Systems H lamp, 0.5 J/cm$^2$). The Surlyn® film was removed from the irradiated adhesive film sample. The glass microscope cover slip with the adhesive film sample was placed on a hot plate heated to 100° C., and a second glass microscope cover slip was carefully placed on the adhesive film sample and laminated by hand with a 2.3 kilogram rubber roller. The laminated sample was heated for one hour in an oven set at 160° C. No voids were visible with a microscope set at 30× amplification.

Preparation of Butylacrylate/Glycidyl Methacrylate (Ba/Gma) Copolymer

The following were added to a 946 mL bottle: 72.0 g of butyl acrylate (Dow Chemical Co., Midland, Mich.), 48.0 g of glydicyl methacrylate (Sartomer Co. Inc., Easton, Pa.), 0.18 g

| Designation | Source | Description |
|---|---|---|
| Epiclon 7200H | Dainippon Ink and Chemicals Industries, Tokyo, Japan | Epoxy Resin |
| Epon 828 | Hexion Specialty Chemicals, Columbus, OH | Epoxy Resin |
| Epon 862 | Hexion Specialty Chemicals | Epoxy Resin |
| TMPTA | Sartomer Company Inc., Easton, PA | Trimethylolpropanetriacrylate |
| CN2405 | Sartomer Company Inc., Easton, PA | Urethane/acrylic oligomer-Metallic ion |
| Irgacure 369 | Ciba Specialty Chemicals, Tarrytown, NY | Free radical curing agent |
| Curezol ® 2 MZ Azine | Air Product and Chemical Inc., Allentown, PA | Epoxy resin curing agent |
| A187 Silane | Available from Natrochem, Savannah, GA | Gamma-glycidyloxypropyl trimethoxysilane |
| Epon 164 | Hexion Specialty Chemicals | Epoxy Resin |
| Tactix 756 | Dow Chemical, Midland, MI | Epoxy Resin |
| Irgacure 651 | Ciba Specialty Chemicals, Basel, Switzerland | Free radical curing agent |

Test Methods

Peel Adhesion Test

A 50 μm thick Surlyn® film was laminated to the adhesive film coating. The film laminate was cut into 25 mm strips. The silicone release liner was removed from the adhesive film strips and the adhesive was laminated to a polished silicone wafer using four passes of a 2.0 kg rubber roller. The silicone wafer had been cleaned by wiping the surface three times with heptane. The force to remove the adhesive film strip from the silicone wafer at an angle of 180 degrees was measured using an I-Mass SP-2000 tester (IMASS Inc., Accord, Mass.). The force was measured at a peel speed of 30.5 cm/min. The force to remove some samples from the silicone wafer was measured after the sample had been passed once through a Fusion Systems UV Curing Unit (H lamp, 0.5 J/cm$^2$) (Gaithersburg, Md.).

Properties of the Adhesive Film

The modulus of the UV irradiated and thermally cured adhesive film was measured at 25° C. using a Dynamic Mechanical Analyzer (TA Instruments Inc., New Castle, Del.). The peak temperature of the exothermic chemical process when the adhesive film is heated at 10° C./minute was measured with a Differential Scanning Calorimeter (DSC) obtained from TA Instruments, Inc. The glass transition temperature ($T_g$) of the cured adhesive film was measured with the DSC.

of 2,2'-azobis(2-methylbutanenitrile) (DuPont, Wilmington, Del.), 140 g of ethyl acetate, and 140 g of toluene. The solution was purged with nitrogen for two minutes at a rate of one liter per minute. The bottle was sealed and placed in a water bath that was maintained at 60° C., for 24 hours. The reaction mixture was 29.5 wt % solids, had a measured inherent viscosity of 0.78 dL/g and a Brookfield viscosity of 0.7 Pascal-seconds.

Example 1

All of the components were mixed in a jar and then degassed under reduced pressure in a vacuum oven at room temperature for approximately three minutes. The adhesive coating solution was applied to a silicone treated polyethyleneterephthalate (PET) film with a knife coater to produce a 25 μm thick adhesive after the coating was heated for 7 minutes at 85° C. in a forced air oven.

Examples 1-6

| Example | 1 | 2 | 3 | 4 | 5 | 6 |
|---|---|---|---|---|---|---|
| BA/GMA (3:2) (a) | 9.24 | — | — | — | 9.24 | 10.1 |
| EHA/GMA (3:2) (a) | — | 18.3 | — | — | — | — |

-continued

| Example | 1 | 2 | 3 | 4 | 5 | 6 |
|---|---|---|---|---|---|---|
| EHA/GMA (1:1) (a) | — | — | 9.15 | 9.15 | — | — |
| Epiclon 7200H | 1.35 | 1.8 | 0.9 | — | 1.35 | — |
| Epon 828 | 0.35 | 1.8 | 0.9 | 0.9 | 0.45 | — |
| Epon 862 | 0.1 | | | | | |
| Curezol ® 2 MZ Azine | 0.1 | 0.2 | 0.1 | 0.001 | 0.1 | 0.18 |
| Irgacure 369 | 0.02 | 0.03 | 0.02 | 0.02 | 0.02 | — |
| TMPTA | 0.3 | 0.2 | 0.3 | 0.3 | 0.3 | 0.4 |
| CN2405 | 0.2 | 0.8 | 0.2 | 0.2 | 0.2 | 0.1 |
| A187 Silane | — | — | — | — | — | 0.01 |
| Epon 164 | — | — | — | 0.9 | — | — |
| Tactix 756 | — | — | — | — | — | 1.33 |
| Irgacure 65 1 | | — | — | — | — | 0.03 |

(a) Weight of 30% solution of the polymer in ethyl acetate/toluene (1:1)

Comparative Example

FH8000 Bonding Film from Hitachi Chem. Co. America, Ltd.

TABLE 1

Test Results for Comparative Example and Example 1

|  | Example 1 | Comparative Example |
|---|---|---|
| Initial Peel from silicon wafer (N/25 mm) | 4 (Failure between adhesive and wafer) | 1.4 |
| Peel from silicon wafer after UV (N/25 mm) | 0.15 (Failure between adhesive and Surlyn) | 0.2 |
| 25° C. Modulus (MPa) | 240 | 280 |
| DSC Exotherm Peak Temperature (° C.) | 175 | 190 |
| Glass Transition Temperature (° C.) | 125 | 180 |

TABLE 2

Test Results for Examples 2-6

|  | Initial Peel from Silicon wafer (N/25 mm) (a) | Peel Test After UV Exposure (N/25 mm) (b) |
|---|---|---|
| Example 2 | 7.29 | 2.53 |
| Example 3 | 2.21 | 0.30 |
| Example 4 | 1.35 | 0.25 |
| Example 5 | 4.75 | 0.37 |
| Example 6 | 4.22 | 0.22 |

Peel Mode - The adhesive delaminated from the wafer during the Initial Peel test.
Peel Mode - The Surlyn backing delaminated from the adhesive during the Peel test after UV exposure.

Various modifications and alterations of this invention will become apparent to those skilled in the art without departing from the scope and principles of this invention, and it should be understood that this invention is not to be unduly limited to the illustrative embodiments set forth hereinabove.

We claim:
1. An adhesive composition comprising:
   an acrylate ester polymer having a functional group;
   a multi-functional thermosetting resin;
   a multi-functional acrylate ester;
   an acrylate ester polymerization catalyst or curing agent;
   a thermally-latent catalyst suitable for curing the multi-functional thermosetting resin; and
   an acrylic acid salt,
   wherein the acrylate ester polymer and the thermosetting resin are capable of reacting with each other.
2. The composition of claim 1 wherein the multi-functional thermosetting resin comprises an epoxy resin.
3. The composition of claim 1 wherein acrylate ester polymer comprises a copolymer of butylacrylate and glycidyl methacrylate.
4. The composition of claim 1 wherein the multi-functional acrylate ester comprises trimethylolpropanetriacrylate.
5. The composition of claim 1 wherein the polymerization catalyst or curing agent comprises a photo-initiated free radical curing agent.
6. The composition of claim 1 wherein the thermally-latent catalyst comprises an imidazole accelerator.
7. The composition of claim 1 wherein the acrylic acid salt comprises multivalent metal ions.
8. An adhesive transfer dicing tape suitable for consecutive use as a dicing tape and a die attach adhesive comprising: an adhesive composition according to claim 1; and a backing.
9. An adhesive comprising:
   at least about 50 weight percent (wt%) of a functional group containing acrylate ester polymer;
   from about 20 wt% to about 40 wt% of a multi-functional thermosetting resin;
   an effective amount of a multi-functional acrylate ester;
   a catalyst for curing the acrylate ester polymer;
   a thermally latent catalyst for curing the multi-functional thermosetting resin; and
   an acrylic acid salt,
   wherein the acrylate ester polymer and the thermosetting resin are capable of forming an adhesive reaction product.
10. The composition of claim 9 wherein the multi-functional acrylate ester is provided in an amount above 0 wt% and below about 10 wt%.
11. The composition of claim 9 wherein the thermally latent catalyst is provided in an amount above 0 wt% and below about 10 wt%.
12. The composition of claim 9 wherein the acrylic acid salt comprises multivalent metal ions.
13. The composition of claim 9 further comprising a backing.
14. A semiconductor wafer comprising an active surface and a substrate surface and a layer of the adhesive composition of claim 9 adjacent the substrate surface.
15. A semiconductor chip comprising an active surface and a substrate surface and a layer of the adhesive composition of claim 9 adjacent the substrate surface.
16. A semiconductor chip comprising an active surface and a substrate surface and a region of cured adhesive comprising the reaction product of claim 9 adjacent the substrate surface.
17. A method of making an adhesive comprising:
   providing an acrylate ester polymer having a functional group;
   providing a multi-functional thermosetting resin;
   providing a multi-functional acrylate ester;
   providing an acrylate ester polymer catalyst or curing agent;

providing a thermally-latent catalyst suitable for curing the multi-functional thermosetting resin;
providing an acrylic acid salt;
mixing the polymer, thermosetting resin, multi-functional acrylate ester, acrylate ester polymer catalyst or curing agent, thermally-latent catalyst, and acrylic acid salt to form a mixture; and
optionally degassing the mixture,
wherein the acrylate ester polymer and the thermosetting resin are capable of reacting with each other.

18. The method of claim 17 further comprising coating the mixture onto a release liner to form an adhesive tape precursor.

19. The method of claim 18 further comprising heating the adhesive tape precursor to form a tape, optionally after laminating the adhesive tape precursor to a backing.

20. The method of claim 19 further comprising laminating the tape to a wafer.

* * * * *